United States Patent [19]
Kumazaki

[11] Patent Number: 5,814,875
[45] Date of Patent: Sep. 29, 1998

[54] SEMICONDUCTOR DEVICE AND METHOD OF MANUFACTURING THE SAME APPARATUS AND METHOD FOR PROVIDING SEMICONDUCTOR DEVICES HAVING A FIELD SHIELD ELEMENT BETWEEN DEVICES

[75] Inventor: Yoshihiro Kumazaki, Chiyoda-ku, Japan

[73] Assignee: Nippon Steel Corporation, Tokyo, Japan

[21] Appl. No.: 594,301

[22] Filed: Jan. 30, 1996

[30] Foreign Application Priority Data

Jan. 31, 1995 [JP] Japan .................................. 7-034492

[51] Int. Cl.[6] .............................. H01L 29/76; H01L 29/78
[52] U.S. Cl. ........................... 257/488; 257/491; 257/768
[58] Field of Search ..................................... 257/340, 372, 257/388, 394, 412, 504, 547, 754, 768, 488, 491

[56] References Cited

U.S. PATENT DOCUMENTS 3,970,486   7/1976   Kooi .
4,845,544   7/1989   Shimizu ................................... 257/372
5,164,803   11/1992  Ozaki et al. ............................ 257/394
5,289,025   2/1994   Lee ......................................... 257/299
5,521,419   5/1996   Wakamiya et al. .................... 257/394
5,606,195   2/1997   Hooper et al. ......................... 257/547

FOREIGN PATENT DOCUMENTS 49-39308   10/1974   Japan .
3-85747    4/1991    Japan .

*Primary Examiner*—Donald Monin
*Attorney, Agent, or Firm*—Pollock, Vande Sande & Priddy

[57] ABSTRACT

A field shield element for isolating semiconductor devices formed on a common substrate. The field shield element comprises an electrode of a high melting point metal which may have a reduced thickness and which avoids punch through of a connection point through the field shield electrode during manufacture. By employing the shield gate electrode metal having a high melting point, the reduction in thickness of the shield gate electrode provides a corresponding reduction in thickness of the offset existing between the semiconductor device and the isolation structure formed with the field shield element. The shield gate electrode may be combined with metal silicon compounds, and metal nitrides to realize the foregoing benefits of avoiding punch-through and reducing the offset.

11 Claims, 9 Drawing Sheets

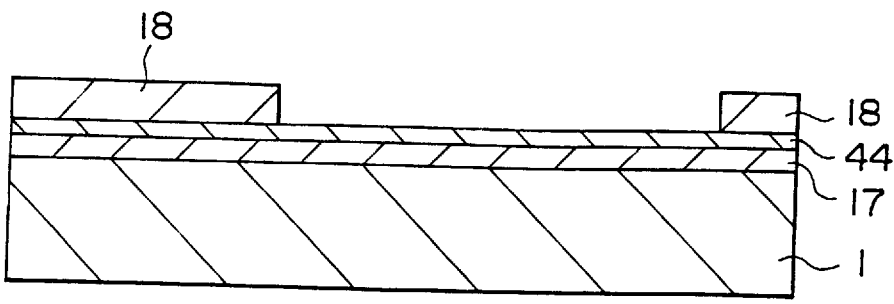
F I G. 3A
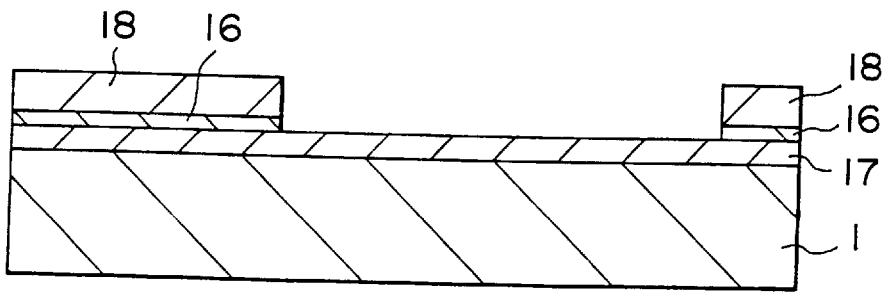
F I G. 3B
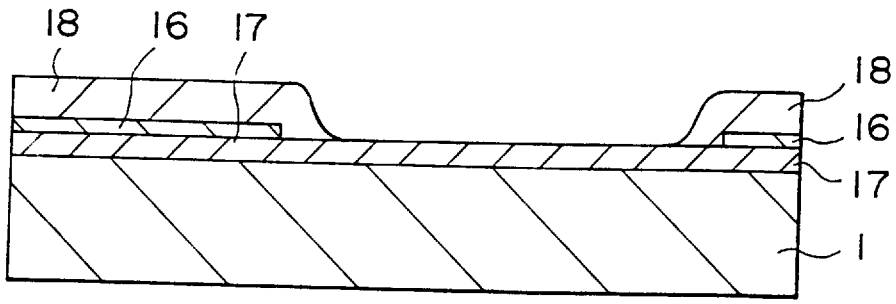
F I G. 3C
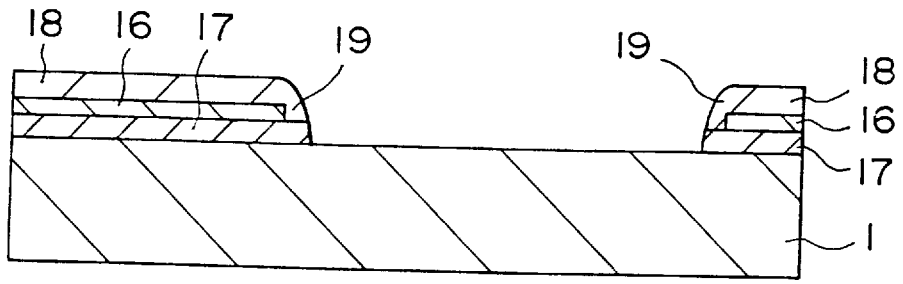
F I G. 3D

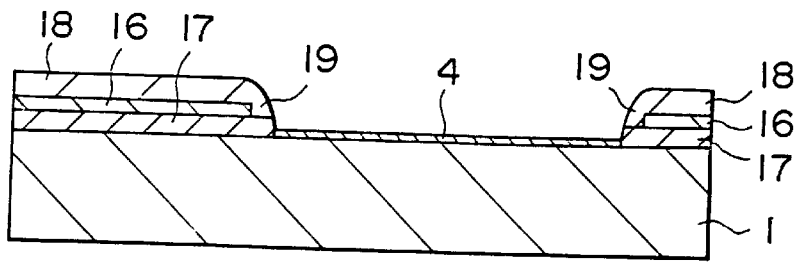
F I G. 4A
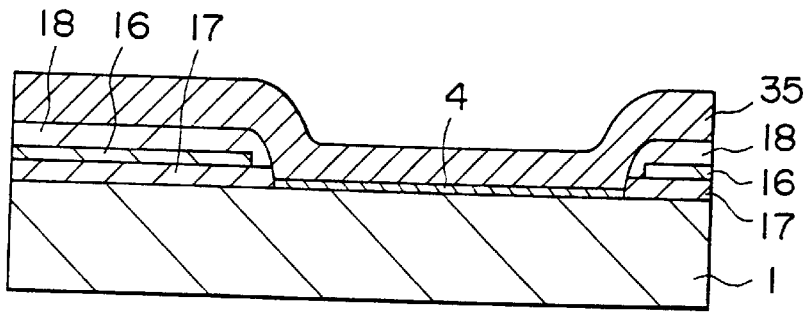
F I G. 4B
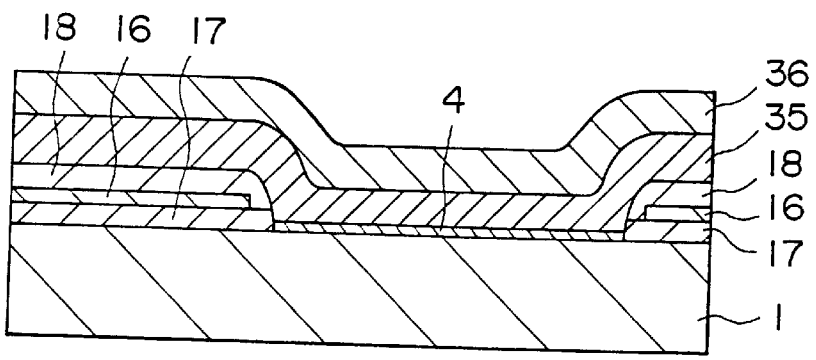
F I G. 4C
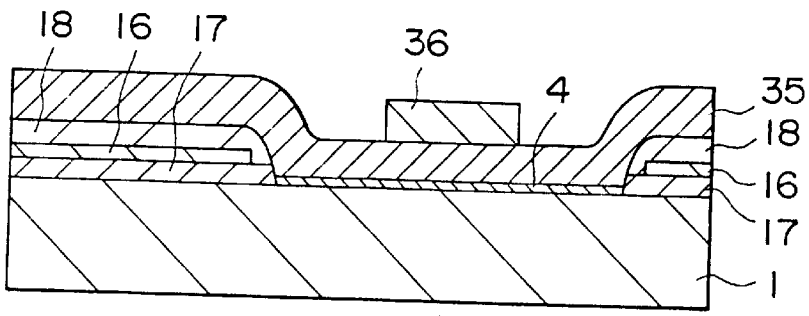
F I G. 4D

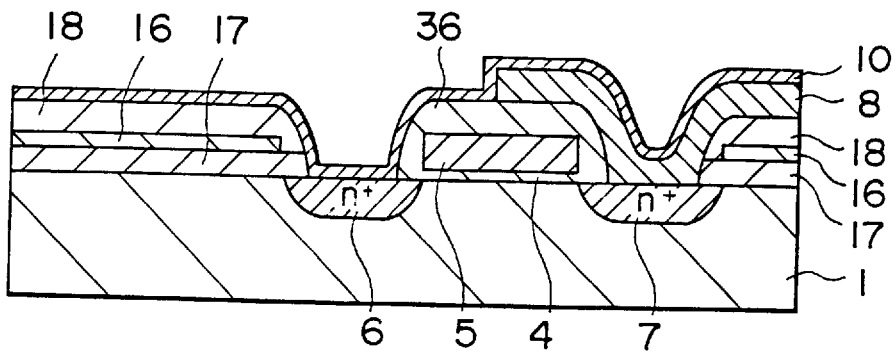
F I G. 7A
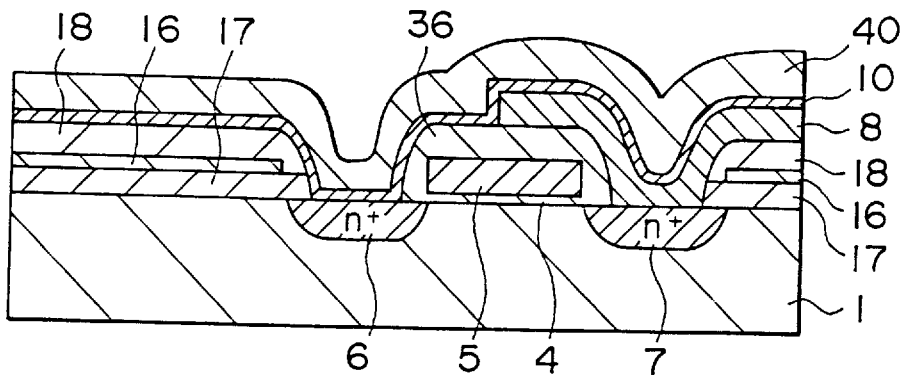
F I G. 7B
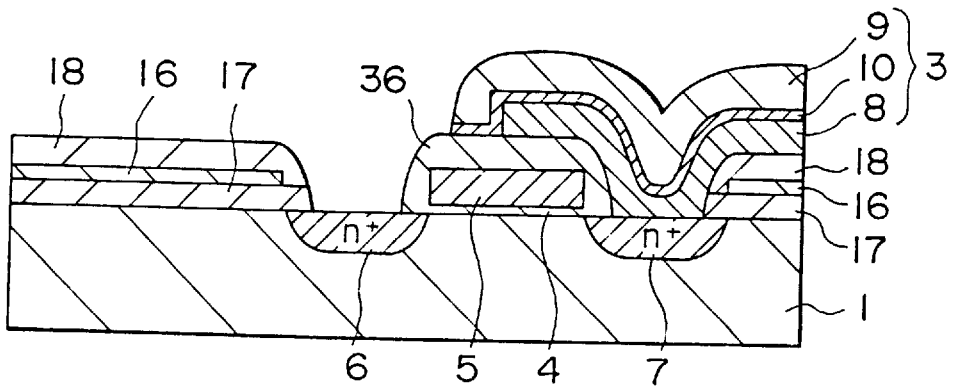
F I G. 7C

SEMICONDUCTOR DEVICE AND METHOD OF MANUFACTURING THE SAME APPARATUS AND METHOD FOR PROVIDING SEMICONDUCTOR DEVICES HAVING A FIELD SHIELD ELEMENT BETWEEN DEVICES

FIELD OF THE INVENTION

This invention relates to a semiconductor device and a method of manufacturing such a semiconductor device, and more particularly to a semiconductor device having a field shield element isolation structure and a method of manufacturing such a semiconductor device.

BACKGROUND OF THE INVENTION

With miniaturization of semiconductor integrated circuits, the element isolation method has been one of the important tasks in the manufacturing technology. As the conventional element isolation method, a method described in the Japanese Patent Publication No. 39308/1974, etc. generally known as selective oxidation method (LOCOS method) has been widely used. However, when element isolation is carried out by the LOCOS method, bird's beak takes place, resulting in limited area of the memory cell area. For this reason, it is difficult to cope with the requirement of high integration of the semiconductor integrated circuits in recent years. In view of the above, as a element isolation method for suppressing occurrence of bird's beak, a so called field shield element isolation system using MOS structure formed on a semiconductor substrate for isolation between devices has been proposed.

The example in which silicide film is used as the field shield electrode is described in the Japanese Patent Application Laid Open No. 85747/1991. This field shield electrode has very thick thickness of 1500 angstroms. In addition, any reference is not made to the etching stopper function at the time of forming contact hole of silicide film.

The field shield element isolation system will be described below.

FIG. 9 is a partial cross sectional view of conventional DRAM employing the structure in which the memory cell is electrically isolated from adjacent device by the field shield element isolation structure.

In FIG. 9, a DRAM memory cell composed of a MOS transistor 92 and a capacitor 93 is formed in the memory cell area. The MOS transistor 92 includes a gate electrode 95 formed through a gate oxide film 94 on a P-type silicon substrate 91, and a source 96 and a drain 97 which are a pair of N-type impurity diffused layers formed at both sides of the gate electrode 95 on the silicon substrate 91 surface. Moreover, the capacitor 93 is composed of a storage electrode 98 connected to the drain 97, a cell plate electrode 99, and a dielectric film 100 between the both electrodes. The MOS transistor 92 and the capacitor 93 are covered by a interlayer insulating film 101, and a metal wiring 102a electrically connected to the source 96 is pattern-formed on the interlayer insulating film 101.

In the element isolation area, a field shield element isolation structure is formed by MOS structure consisting of a shield gate electrode 106 comprised of polycrystalline silicon film having film thickness of about 120 nm to 150 nm, a shield gate oxide film 107, and the silicon substrate 91. The shield gate electrode 106 is grounded through a metal wiring 102b so that it is kept at a fixed potential of 0 volts (ground level). As a result, it is prevented that parasitic channel at the silicon substrate 91 surface directly below the shield gate electrode 106 is formed. Accordingly, adjacent devices can be electrically isolated from each other.

The outline of a conventional method of manufacturing the DRAM shown in FIG. 9 is as follows.

Initially, shield gate electrode 106 of polycrystalline silicon film is pattern-formed thereafter to pattern-form gate electrode 95 of the MOS transistor 92. Thereafter, a silicon oxide film 108 is formed, and storage electrode 98 of the capacitor 93 is then pattern-formed. Further, dielectric film 100 and cell plate electrode 99 are pattern-formed.

However, there were problems as described below in connection with conventional semiconductor devices having the field shield element isolation structure as described above.

In the DRAM of FIG. 9, since film structures in longitudinal direction at the upper portion of the source 96 in which a contact hole 109a is opened and the shield gate electrode 106 portion in which a contact hole 109b is opened are different from each other, the contact holes 109a, 109b opened in the interlayer insulating film 101 have depths different from each other. Namely, since the depth of the contact hole 109a is greater than the depth of the contact hole 109b, when these contact holes are formed by etching at the same time, an overetching portion 110 would inevitably take place at the upper portion of the shield gate electrode 106. Accordingly, there takes place the state where the contact hole 109b is punched (penetrated) through the shield gate electrode 106, so the metal wiring 102b and the silicon substrate 91 are short-circuited. In order to avoid this, the shield gate electrode 106 had to be formed so that its film thickness is sufficiently thick.

However, when the film thickness of the shield gate electrode 106 is thick, etching remainder takes place in pattern-forming the shield gate electrode thereafter to form gate electrode 95 by patterning polycrystalline silicon film stacked on the entire surface. Namely, a large offset takes place, as shown in FIG. 9, at the boundary portion between the memory cell area in the vicinity of the end portion of the shield gate electrode 106 and the element isolation area. As a result, etching of the remainder of polycrystalline silicon film would take place at the offset portion. Such etching remainder is in ribbon form or in stick form, and constituted to produce short-circuit failure between wirings. In addition, similar problem took place also in pattern-forming storage electrode 98 of capacitor 93.

In short, in the conventional semiconductor devices having the field shield element isolation structure, also in both the case where the shield gate electrode 106 is formed so that its film thickness is thick and the case where the shield gate electrode 106 is formed so that its film thickness is thin, it was impossible to securely prevent short-circuit of wiring.

SUMMARY OF THE INVENTION

An object of this invention is to provide a semiconductor device having field shield element isolation structure, wherein a measure is taken to prevent a contact hole opened at the upper portion of the shield gate electrode from being punched (penetrated) through the shield gate electrode, and to prevent etching remainder from taking place at the offset portion resulting from the shield gate electrode in pattern-forming gate electrode, etc. in the memory cell area, thereby to improve reliability.

This invention is directed to a method of manufacturing a semiconductor device in which isolation between devices is carried out by the field shield element isolation structure, characterized in that the method comprises the steps of forming a first insulating film on a semiconductor substrate, pattern-forming a shield gate electrode including at least one kind of material selected from a group of high melting point metal, metal silicon compound and metal nitride, and coating (covering) the shield gate electrode by a second insulating film.

In addition, this invention is directed to a semiconductor device where isolation between devices is carried out by the field shield element isolation structure in which a shield gate electrode is formed through an insulating film on a semiconductor substrate, characterized in that the shield gate electrode includes at least one kind of material selected from a group of high melting point metal, metal silicon compound and metal nitride.

BRIEF EXPLANATION OF THE DRAWINGS

FIGS. 3A–3D is a cross sectional view for explaining process for manufacturing the DRAM of this invention shown in FIG. 1.

FIGS. 4A–4D is a cross sectional view for explaining process for manufacturing the DRAM of this invention shown in FIG. 1.

FIGS. 7A–7C is a cross sectional view for explaining process for manufacturing the DRAM of this invention shown in FIG. 1.

DETAILED DESCRIPTION OF THE INVENTION

Figure 1:
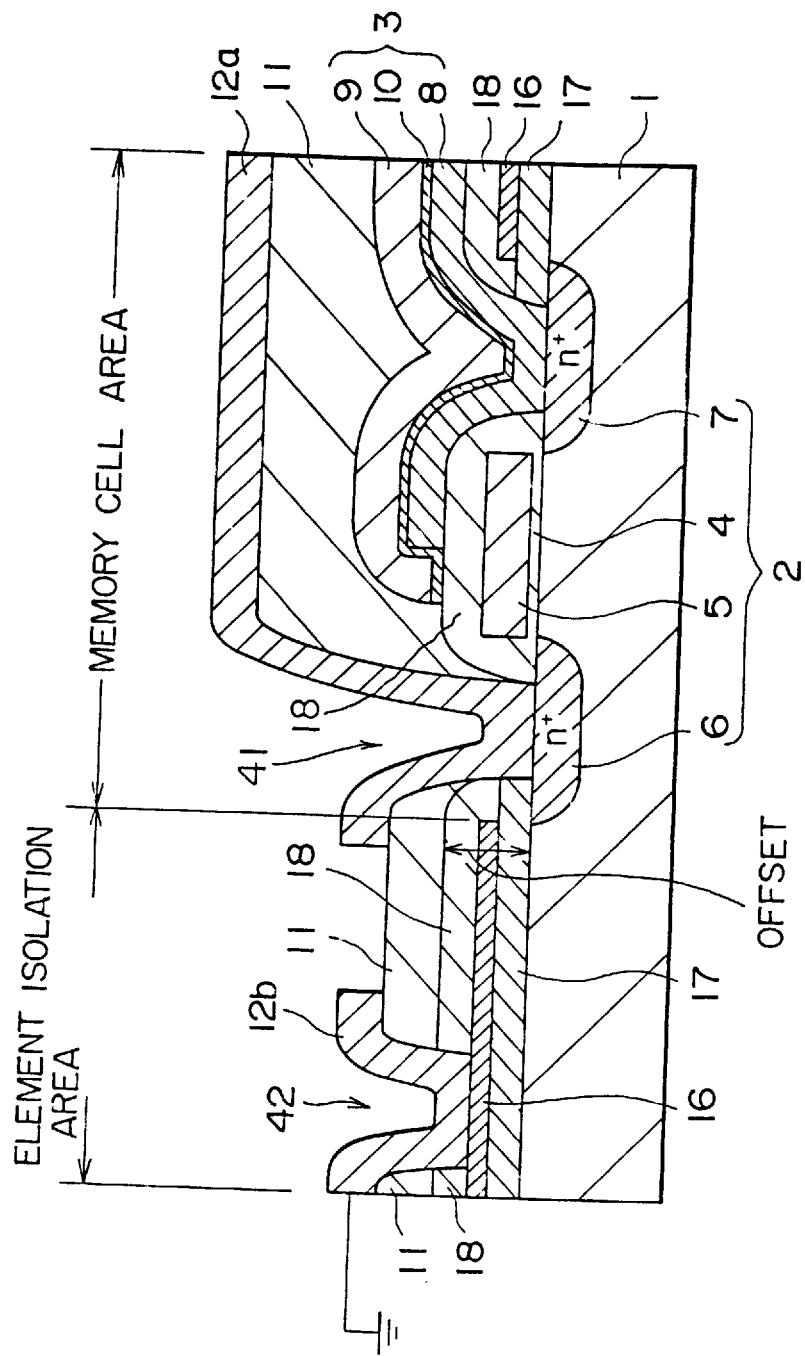
FIG. 1 is a cross sectional view showing the outline of the structure of DRAM of an embodiment of this invention.

FIG. 1 is a schematic cross sectional view of a semiconductor device of an embodiment of this invention. In FIG. 1, a DRAM memory cell consisting of a MOS transistor 2 and a capacitor 3 is formed in the memory cell area.

The MOS transistor 2 includes a gate electrode 5 formed through a gate oxide film 4 on a P-type silicon substrate 1, and a source 6 and a drain 7 which are a pair of N-type impurity diffused layer formed on the both sides of the gate electrode 5 on the surface of the silicon substrate 1. A silicon oxide film 18 is formed on the gate electrode 5. Moreover, the capacitor 3 is composed of a storage electrode 8 electrically connected to the drain 7, a cell plate electrode 9 formed in a manner opposite to the storage electrode 8, and a dielectric film 10 put between the both electrodes. The MOS transistor 2 and the capacitor 3 are covered by an interlayer insulating film 11, and an aluminum wiring 12a connected to the source 6 through a contact hole 41 is pattern-formed on the interlayer insulating film 11.

In the element isolation area, a field shield element isolation structure is formed by an MOS structure composed of a shield gate electrode 16 having film thickness of about 40 nm consisting of molybdenum (Mo), a shield gate oxide film 17, and a silicon substrate 1. A silicon oxide film 18 and an interlayer insulating film 11 are formed on the shield gate electrode 16. The shield gate electrode 16 is connected to a grounded aluminum wiring 12b through a contact hole 42 so that it is kept at a fixed potential of 0 volts (ground level) at all times. As a result, a parasitic channel at the surface of the silicon substrate 1 directly below the shield gate electrode 16 is presented. Accordingly, adjacent memory cells can be electrically isolated from each other.

A method of manufacturing the DRAM of this invention shown in FIG. 1 will now be described in detail with reference to FIGS. 2 to 8 in accordance with respective manufacturing process steps.

Figure 2A:
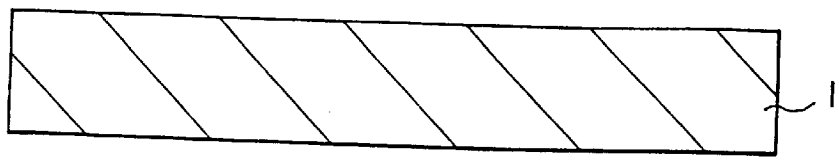
FIGS. 2A and 2B is a cross sectional view for explaining process for manufacturing the DRAM of this invention shown in FIG. 1.
Figure 2B:
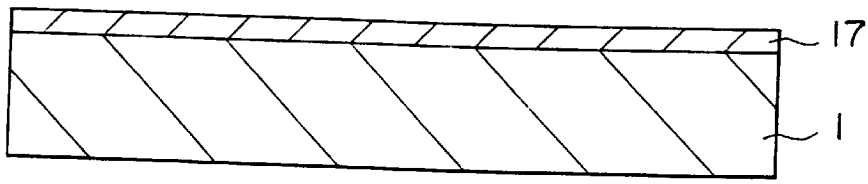

(1) Initially, silicon gate oxide film 17 having film thickness of about 50 nm is formed by thermal oxidation process on silicon substrate 1 shown in FIG. 2A (FIG. 2B).

Figure 2C:
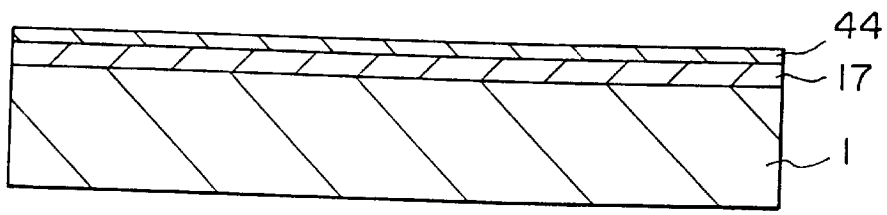
Figure 2D:
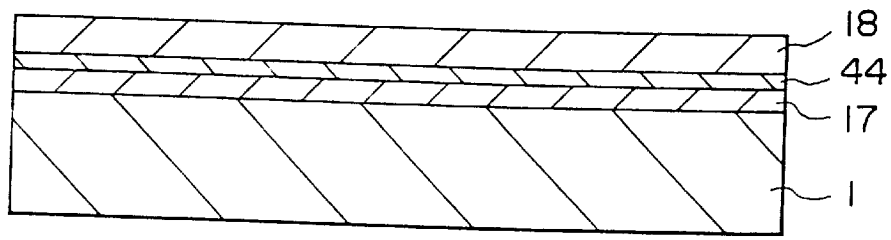

Then, molybdenum (Mo) film 44 having film thickness of about 40 nm is formed by the sputtering process on the shield gate oxide film 17 (FIG. 2C). Then, silicon oxide film 18 having film thickness of about 200 nm is formed by low pressure CVD process on the molybdenum film 44 (FIG. 2D).

(2) The silicon oxide film 18 in the memory cell area shown in FIG. 3A is removed by etching by the photolithography using photoresist (not shown).

Then, the molybdenum film 44 is selectively removed by etching with the etched silicon oxide film 18 being as a mask to form shield gate electrode 16 comprised of molybdenum film 44 (FIG. 3B). Then, silicon oxide film 18 is further stacked on the entire surface by about 200 nm (FIG. 3C).

Further, the entire surface of the silicon substrate 1 is etched back to thereby form a side wall oxide film 19 at the side surface of the shield gate electrode 16 (FIG. 3D).

(3) Gate oxide film 4 having film thickness of about 17 nm is formed by the thermal oxidation process on the silicon substrate 1 shown in FIG. 4A.

Then, phosphorus (P) doped polycrystalline silicon film 35 having film thickness of about 200 nm is formed on the entire surface by the low pressure CVD process (FIG. 4B). Then, a silicon oxide film 36 of film thickness of about 200 nm is formed by the low pressure CVD process on the polycrystalline silicon film 35 (FIG. 4C).

Further, the silicon oxide film 36 is selectively removed by etching by the photolithography using photoresist (not shown) so that the silicon oxide film 36 is left in a gate wiring form (FIG. 4D). Thereafter, the photoresist is removed.

Figure 5A:
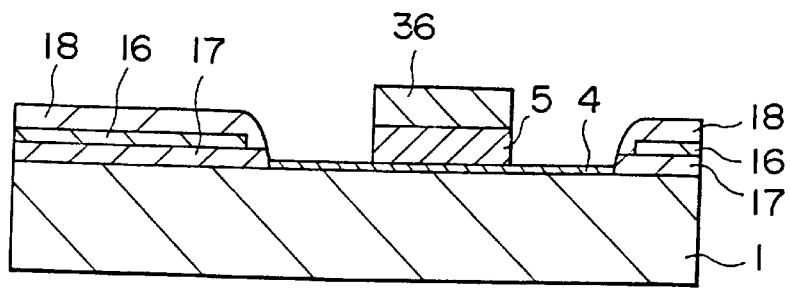
FIGS. 5A–5D is a cross sectional view for explaining process for manufacturing the DRAM of this invention shown in FIG. 1.
Figure 9:
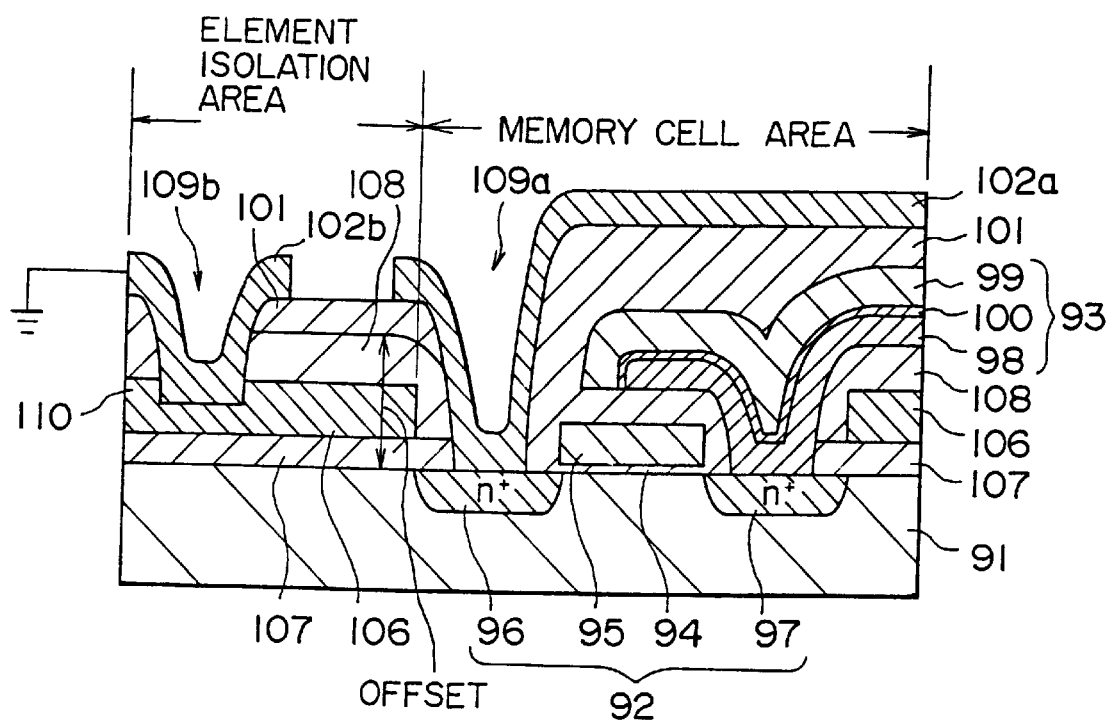
FIG. 9 is a cross sectional view showing the outline of the structure of a conventional DRAM.

(4) The polycrystalline silicon film 35 is etched with the etched silicon oxide film 36 shown in FIG. 5A being as a mask to form gate electrode 5 comprised of polycrystalline silicon film 35. At this time, since the film thickness of the shield gate electrode 16 is about 40 nm, which is thinner than that the case of the prior art (FIG. 9) by about 80 nm to 110 nm, the offset between the memory cell area and the element isolation area in forming the gate electrode 5 by etching is reduced to the same degree as above. Accordingly, in this embodiment, there is no possibility that the polycrystalline silicon film 35 is left in a ribbon form or in a stick form along the offset portion as in the case of the prior art. Any remaining pattern of the polycrystalline silicon film 35 was not confirmed.

Figure 5B:
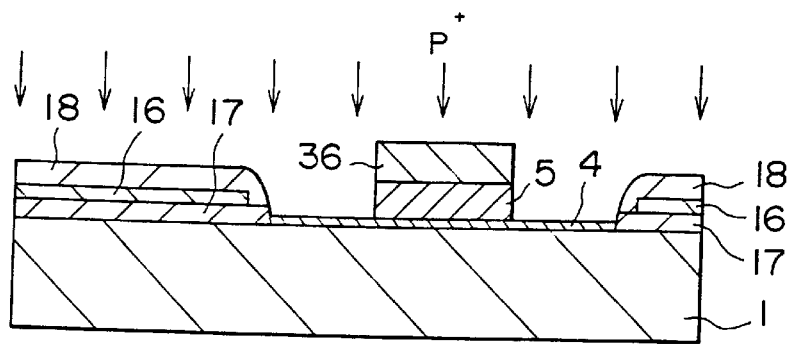

(5) As shown in FIG. 5B, phosphorus (P) is ion-implanted with the gate electrode 5 and the shield gate electrode 16 being as a mask under the condition of acceleration energy of 30 KeV, and dose quantity of $1.5 \times 10^{13}$ cm$^{-2}$ to form LDD layer (N$^-$) (not shown) of the MOS transistor 2 formed in the memory cell area.

Figure 5C:
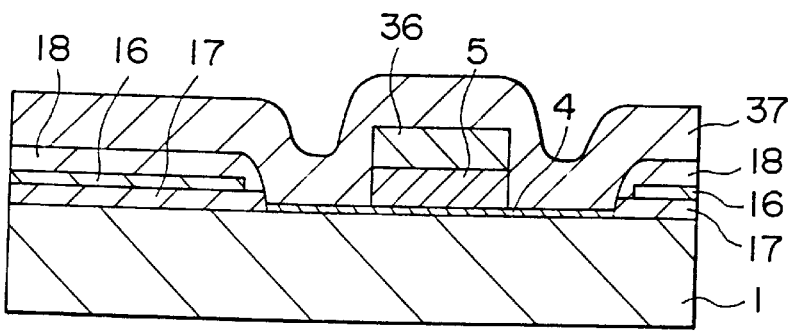

Then, a silicon oxide film 37 is stacked on the entire surface by the low pressure CVD process so that film thickness is equal to about 200 nm (FIG. 5C).

Figure 5D:
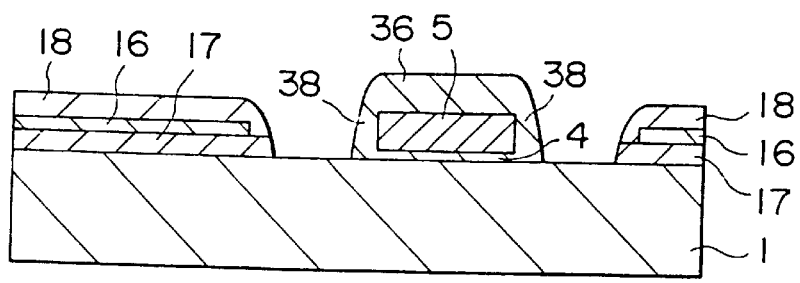

Further, the entire surface is etched back to thereby form a side wall oxide film 38 at the side surface of the gate electrode 5 (FIG. 5D).

Figure 6A:
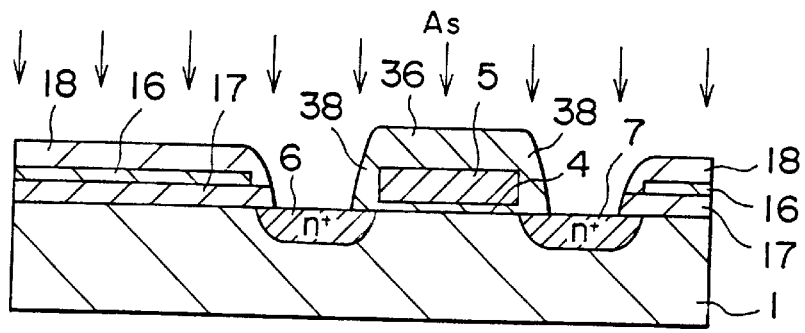
FIGS. 6A–6D is a cross sectional view for explaining process for manufacturing the DRAM of this invention shown in FIG. 1.

(6) As shown in FIG. 6A, arsenic (As) is ion-implanted with the gate electrode and the shield gate electrode 16 being as a mask under the condition of acceleration energy of 50 KeV, and dose quantity of $2.0 \times 10^{15}$ cm$^{-2}$ to form source 6 and drain 7 of the MOS transistor formed in the memory cell area.

Figure 6B:
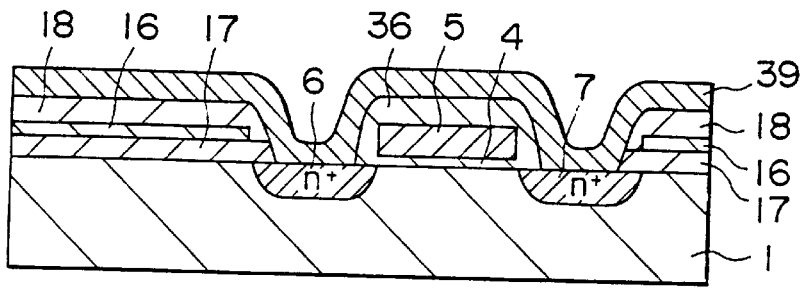

Then, a polycrystalline silicon film 39 having film thickness of about 200 nm is formed on the entire surface by the low pressure CVD process in a manner to be in contact with the drain 7 (FIG. 6B).

Figure 6C:
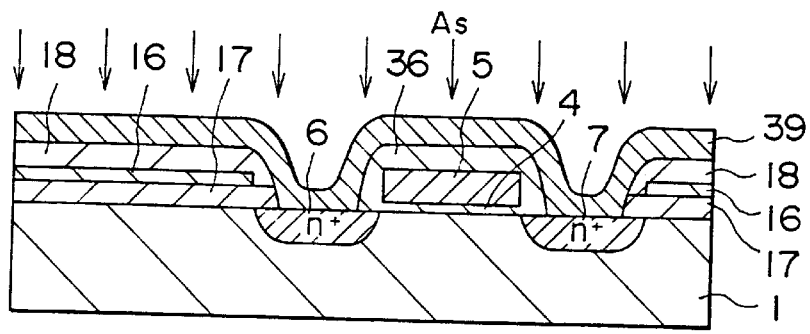

Further, arsenic (As) is ion-implanted into the polycrystalline silicon film 39 under the condition of acceleration energy of 50 KeV and dose quantity of $2.0 \times 10^{15}$ cm$^{-2}$ (FIG. 6C).

Figure 6D:
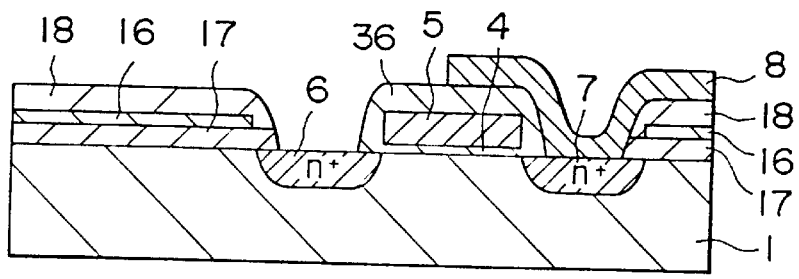

(7) As shown in FIG. 6D, the polycrystalline silicon film 39 is caused to undergo patterning by dry etching using photoresist (not shown) to form storage electrode 8 which is the lower electrode of the capacitor. Also at this time, since the offset between the memory cell area and the element isolation area is smaller than that of the prior art similarly to the case of forming the gate electrode 5 by etching, there is no possibility that polycrystalline silicon film 39 remains in a ribbon form or in a stick form along the offset portion of the source 6 side as in the case of the prior art.

(8) As shown in FIG. 7A, ONO (silicon oxide film/silicon nitride film/silicon oxide film) film 10 having film thickness of 11 nm which is dielectric film is formed on the entire surface.

Then, a phosphorus (P) doped polycrystalline silicon film 40 having film thickness of about 120 nm is formed by the low pressure CVD process on the entire surface (FIG. 7B).

Further, the ONO film 10 and the polycrystalline silicon film 40 are caused to undergo patterning by dry etching using photoresist (not shown) to form cell plate electrode 9 serving as the upper electrode of the capacitor. Thus, capacitor 3 composed of storage electrode 8, ONO film 10 and cell plate electrode 9 is formed (FIG. 7C).

Figure 8A:
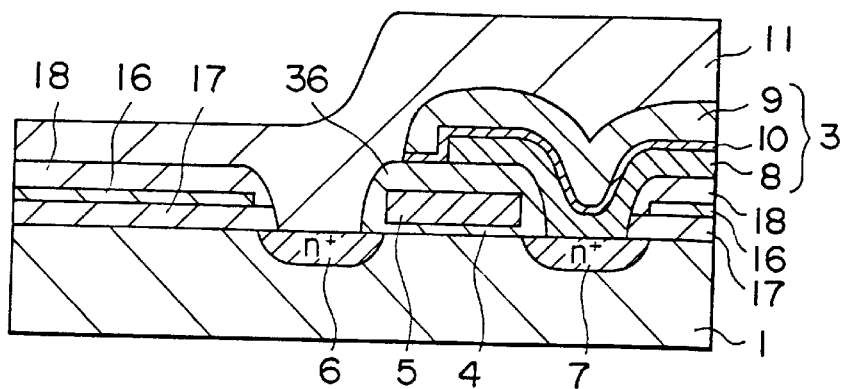
FIGS. 8A–8C is a cross sectional view for explaining process for manufacturing the DRAM of this invention shown in FIG. 1.

(9) As shown in FIG. 8A, silicon oxide film having film thickness of about 50 nm and BPSG film having film thickness of about 600 nm are stacked on the entire surface to carry out reflow thermal processing at a temperature of 950° C. to thereby form interlayer insulating film 11.

Figure 8B:
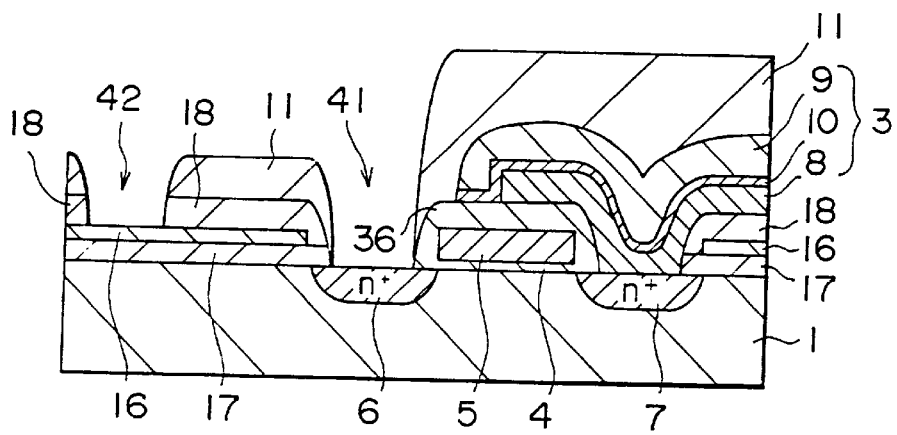

Then, as shown in FIG. 8B, a contact hole 41 and a contact hole 42 are respectively opened at the source 6 upper portion of the interlayer insulating film 11 and the shield gate electrode 16 upper portion by dry etching using photoresist (not shown).

Etching gas used at this time is mixture gas of C$_2$F$_6$ gas and CHF$_3$ gas. The etching selection ratio between the silicon oxide film 18 or the interlayer insulating film 11 and the shield gate electrode 16 comprised of molybdenum under such condition is 30 to 40. On the contrary, in the prior art (FIG. 9), the etching selection ratio between the silicon oxide film, etc. and the shield gate electrode comprised of polycrystalline silicon is about 5 to 8 under the same condition. Accordingly, in this embodiment, even if the shield gate electrode 16 has film thickness of about 40 nm, there is no possibility that the contact hole 42 is punched (penetrated) through the shield gate electrode 16 at the dry etching process to reach the silicon substrate 1.

Figure 8C:
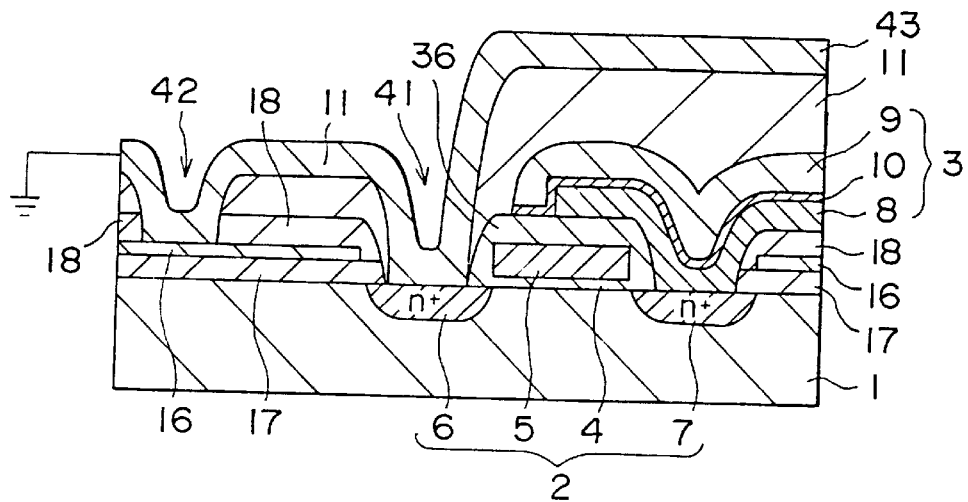

(10) As shown in FIG. 8C, an aluminum thin film 43 having film thickness of about 500 nm is vacuum-deposited on the entire surface by sputtering. Finally, this aluminum thin film 43 is caused to undergo patterning to thereby form aluminum wirings 12a, 12b. Thus, DRAM memory cell of this invention as shown in FIG. 1 is completed.

In this invention, in the case where the shield gate electrode is formed by polycrystalline silicon, the film thickness of the shield gate electrode, which required about 120 nm to 150 nm at the minimum in the prior art, is permitted to be reduced to thin thickness of about 10 nm to 50 nm. Accordingly, the offset at the boundary portion between the element isolation area and the memory cell area can be reduced to 70 nm to 140 nm.

As explained above, in the DRAM memory of this invention, since the shield gate electrode 16 consists of molybdenum (Mo), even if the film thickness is reduced, there is no possibility that the contact hole 42 is punched (penetrated) through the silicon substrate 1. Accordingly, it is possible to prevent short-circuiting between the aluminum wiring 12b and the silicon substrate 1. Further, since the film thickness of the shield gate electrode 16 is small, the offset at the boundary portion between the memory cell area and the element isolation area can be reduced. As a result, there is no possibility that etching remainder takes place at the offset portion at the time of pattern-forming the gate electrode 5 and/or the storage electrode 8. Accordingly, it can be prevented that short (short-circuiting) between wirings resulting from the etching remainder takes place.

While the shield gate electrode 16 is formed by molybdenum (Mo) in this embodiment, the shield gate electrode 16 may be comprised of material capable of providing etching speed lower than that of the insulating film such as silicon oxide film, etc. at the portion where contact hole 41, 42 is opened, e.g., providing an etching selection ratio 30 times greater than that. To realize this, it is sufficient that the shield gate electrode 16 includes at least one kind of material of high melting point metal, metal silicon compound (silicide) and metal nitride (nitride).

It is preferable that molybdenum (Mo), platinum (Pt), tantalum (Ta), tungsten (W), titanium (Ti), or alloy or mixture thereof is used as the high melting point metal. Moreover, it is preferable that molybdenum silicide (MoSi$_2$), platinum silicide (PtSi), tantalum silicide (TaSiO$_2$), tungsten silicide (WSi$_2$), titanium silicide (TiSi$_2$), or mixture thereof is used as the metal silicon compound. Further, it is preferable that molybdenum nitride (MoN), tantalum nitride (TaN), tungsten nitride (WN), titanium nitride (TiN), or mixture thereof is used as the metal nitride.

This invention is not limited to the above-described embodiment, but is permitted to carry out various design changes, e.g., application to semiconductor devices such as EEPROM except for DRAM.

As described above, in accordance with this invention, since the shield gate electrode is formed by material such as molybdenum generally difficult to be etched than the insulating film such as silicon oxide film, etc., even if the film thickness of the shield gate electrode is reduced to a large degree, there is no possibility that the contact hole formed at the insulating film above the shield gate electrode is punched (penetrated) through the semiconductor substrate portion.

Thus, there is no possibility that the semiconductor substrate portion and the wiring formed at this portion might be short-circuited.

Further, as the result of the fact that the film thickness of the shield gate electrode can be reduced to much degree, the offset between the element isolation area and the area where the device is to be formed resulting from the thickness of the shield gate electrode can be reduced to a large degree. Since the film thickness of the shield gate electrode, which required about 120 nm to 150 nm at the minimum in the case where such electrode is formed by, e.g., polycrystalline silicon can be reduced to thin thickness of about 10 nm to 50 nm, the offset at the boundary portion between the element isolation area and the memory cell area can be reduced to 70 nm to 140 nm. Thus, in pattern-forming gate electrode, etc. of the MOS transistor in the memory cell area, no etching remainder takes place at the offset portion. Accordingly, no short (short-circuit) between wirings takes place.

What is claimed is:

1. A semiconductor device where isolation between semiconductor devices is carried out by a field shield element isolation structure in which a shield gate electrode is formed through an insulating film on a semiconductor substrate, wherein the shield gate electrode includes a high melting point metal, said high melting point metal having a lower etching speed than said insulating film to prevent punch through of said shield gate during etching of said insulating film, permitting a reduced shield gate electrode thickness which proportionally reduces a vertical offset between said field isolation structure and an adjacent semiconductor device along a boundary with said adjacent semiconductor device.

2. A semiconductor device as set forth in claim 1, wherein the thickness of the shield gate electrode is 15 to 40 nm.

3. A semiconductor device as set forth in claim 1, wherein the high melting point metal is at least one kind of material selected from a group of molybdenum (Mo), platinum (Pt), tantalum (Ta), tungsten (W) and titanium (Ti).

4. A semiconductor device as set forth in claim 2, wherein the high melting point metal is at least one kind of material selected from a group of molybdenum (Mo), platinum (Pt), tantalum (Ta), tungsten (W) and titanium (Ti).

5. A shield gate electrode employed to constitute a field shield element isolation structure to carry out isolation between semiconductor devices, wherein the shield gate electrode is pattern-formed on an insulating film formed on a semiconductor substrate, and includes a high melting point metal, said high melting point metal having a lower etching speed than said insulating film to prevent punch through of said shield gate during etching of said insulating film, permitting a reduced shield gate electrode thickness which reduces a vertical offset between said field isolation structure and an adjacent semiconductor device along a boundary with said adjacent semiconductor device.

6. A shield gate electrode as set forth in claim 5, wherein the thickness of the shield gate electrode is 15 to 40 nm.

7. A shield gate electrode as set forth in claim 5, wherein the high melting point metal is at least one kind of material selected from a group of molybdenum (Mo), platinum (Pt), tantalum (Ta), tungsten (W), and titanium (Ti).

8. A shield gate electrode as set forth in claim 6, wherein the high melting point metal is at least one kind of material selected from a group of molybdenum (Mo), platinum (Pt), tantalum (Ta), tungsten (W) and titanium (Ti).

9. A semiconductor device having a field shield element isolation structure comprising:

a field shield insulating film on a semiconductor substrate; and a field shield gate electrode, providing on the field shield insulating film, includes at least one kind of material selected from a group of high melting point metal, metal silicon compound (silicide) and metal nitride (nitride), said high melting point metal having a lower etching speed than said insulating film to prevent punch through of said shield gate during etching of said insulating film, permitting a reduced shield gate electrode thickness which reduces a vertical offset between said field isolation structure and an adjacent semiconductor device along a boundary with said adjacent semiconductor device.

10. A semiconductor device as set forth in claim 9, wherein the thickness of the shield gate electrode is 15 to 40 nm.

11. A semiconductor device as set forth in claim 9, wherein the high melting point metal is at least one kind of material selected from a group of molybdenum (Mo), platinum (Pt), tantalum (Ta), tungsten (W) and titanium (Ti).

* * * * *